United States Patent [19]

Nakamura et al.

[11] Patent Number: 5,418,387

[45] Date of Patent: May 23, 1995

[54] SOLID-STATE IMAGING DEVICE WITH NAND CELL STRUCTURE

[75] Inventors: Nobuo Nakamura, Sagamihara; Nahoko Endo, Yokohama; Yoshiyuki Matsunaga, Kamakura, all of Japan

[73] Assignee: Kabushiki Kaisha Toshiba, Kawasaki, Japan

[21] Appl. No.: 173,081

[22] Filed: Dec. 27, 1993

[30] Foreign Application Priority Data

Dec. 28, 1992 [JP] Japan ................... 4-348275

[51] Int. Cl.⁶ ............... H01L 29/78; H01L 27/14; H01L 31/00
[52] U.S. Cl. .................... 257/231; 257/222; 257/232; 257/233; 257/240; 257/241
[58] Field of Search ............ 257/222, 231, 232, 233, 257/234, 240, 241

[56] References Cited

U.S. PATENT DOCUMENTS

| | | | |
|---|---|---|---|
| 4,694,316 | 9/1987 | Chabbal | 257/231 |
| 4,744,057 | 5/1988 | Descure et al. | 257/231 |
| 4,912,560 | 3/1990 | Osawa et al. | 257/232 |
| 5,237,190 | 8/1993 | Wu et al. | 257/233 |

FOREIGN PATENT DOCUMENTS 4-239174  8/1992  Japan ................... 257/233

OTHER PUBLICATIONS

"Metal–Nitride–Oxide–Silicon–Capacitor Arrays as Electrical and Optical Stores", Vanstone, G. F., Electronics Letters, vol. 8, No. 1, pp. 13–14, Jan. 1972.

*Primary Examiner*—Ngân V. Ngô
*Attorney, Agent, or Firm*—Finnegan, Henderson, Farabow, Garrett & Dunner

[57] ABSTRACT

A solid-state imaging device includes a semiconductor substrate, an array of cells on the substrate, a plurality of vertical charge transfer sections extending in a first direction on the substrate, and a horizontal charge transfer section extending in a second direction transverse to the first direction on the substrate and being coupled to the vertical charge transfer section. The cell array includes a plurality of columns of cells that are associated with a corresponding one of the vertical transfer sections. The cell columns include a predetermined number of spaced-part cells that are series-connected along the second direction to constitute a NAND type cell structure. At least one cell-to-cell charge transfer electrode overlies a channel region as defined between adjacent ones of the NAND cells in the substrate.

11 Claims, 5 Drawing Sheets

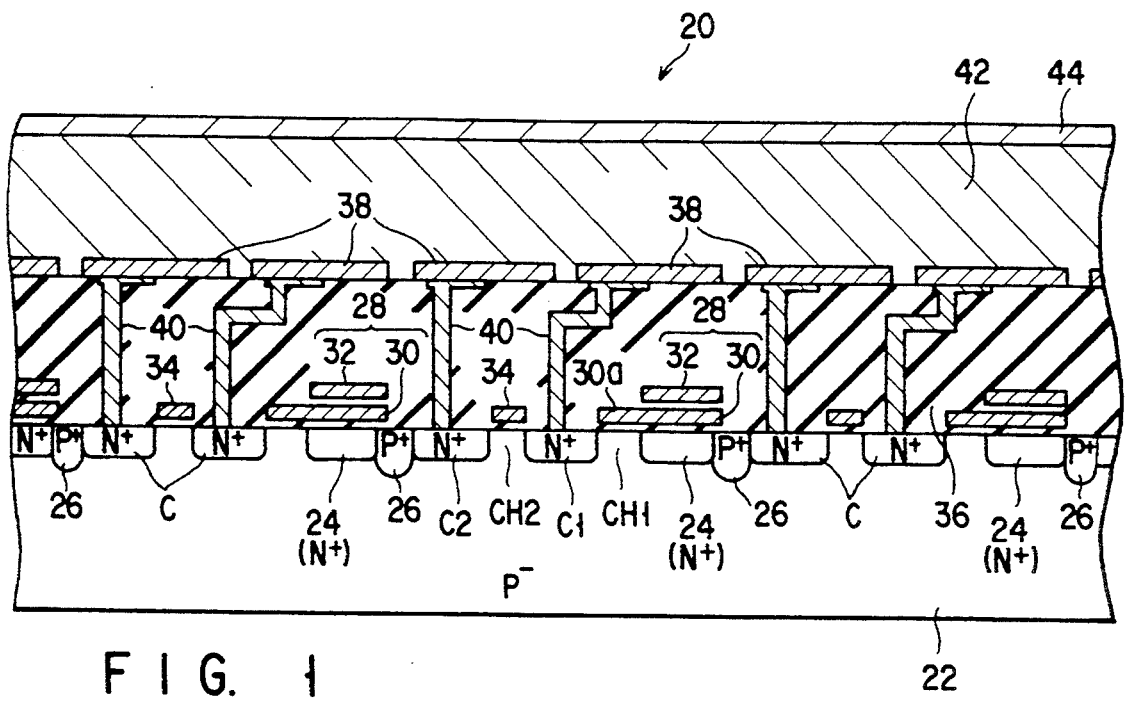
F I G. 1
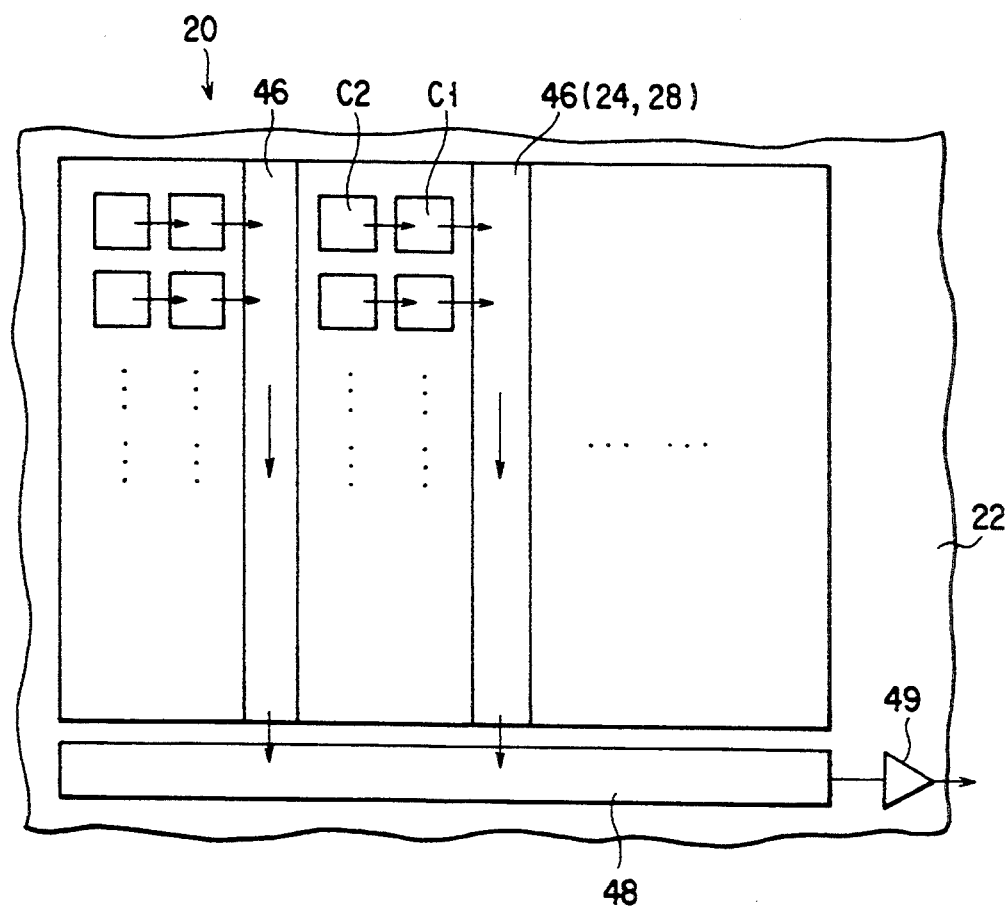
F I G. 2

SOLID-STATE IMAGING DEVICE WITH NAND CELL STRUCTURE

BACKGROUND OF THE INVENTION

1. Field of the Invention

The present invention relates in general to solid-state imaging devices, and in more particular to charge-coupled device (CCD) image sensors. The invention also relates to highly integrated semiconductor imagers for use in small size photoelectric equipments such as video movie cameras, electronic still cameras or the like, the imagers providing an electrical signal indicative of an incident image introduced from a scene.

2. Description of the Related Art

With the increasing needs for high performance and "down-sizing" of photoelectric equipments such as home-use video cameras, personal electronic still cameras or the like, development of a solid-state image sensing device with further enhanced integration density has been demanded strongly. As the number of cells increases on a semiconductor substrate of limited size, the cell size decreases, the magnitude of the charge storage (charge handling capability) in each cell of necessity decreases. These factors reduce the sensitivity, which may lead to a decrease in the quality of sensed image.

The presently available charge-coupled device (CCD) image sensors include an array of rows and columns of picture elements or cells each having a diode for storing therein a packet of photoelectrically produced signal-charge carriers indicative of an incident image introduced from a scene. A plurality of charge transfer sections called the "vertical CCD shift registers" extend along the columns of cells on the substrate in such a manner that each vertical CCD shift register is associated with a corresponding one of the columns of cells. The vertical CCD shift registers are coupled at their outputs to another charge transfer section that extends perpendicularly to the vertical CCD shift registers, which is known as the "horizontal CCD shift register" among those skilled in the art to which the invention pertains.

In other words the prior art CCD imagers should require the presence of one vertical charge transfer section with respect to the photosensitive section of each of a number of cells. This necessitates the alternate positioning of the vertical charge transfer sections and the columns of cells on the substrate of a limited surface area. It should not be permissible that such transfer sections are simply decreased in width in order to provide the charge transfer performance of necessity. The prior art imagers are arranged so as to cause the occupation ratio of the vertical transfer sections on the substrate surface to be greater than a predetermined allowable value. This is due to the fact that, if the width of vertical transfer sections is decreased to increase the effective substrate surface area used for the layout of cell array thereon in order to achieve a further integration density, the resultant signal-charge transferring performance of the vertical transfer sections toward the horizontal charge transfer section is decreased, which leads to the impossibility of transferring sufficient sensed signal charge packet. This is a serious bar to the achievement of further integration density of CCD imagers. There is a trade-off between the accomplishment of further integration density and that of higher quality of a reproduced image; the conflicting objectives have forced experts in the art to suffer from walking the long and winding road of comprise.

To enhance the integration, a photoconversion layer overlaid image sensor has been developed, which may be called the "photoconductive-layered solid-state imaging device" (PSID). With the imager of this type, an amorphous semiconductor photoconductive film is stacked over a substrate to cover an array of rows and columns of cells as a whole. The film may internally produce a packet of signal charge carriers corresponding to an optical image introduced to the film, which carriers are then supplied by lead electrodes to respective cells each having a PN-junction diode for charge storage.

According to the photoconversion layer overlaid CCD imager, the aperture ratio of photodiodes is almost 100 percent, causing the cell size of necessity to decrease accordingly. The effective substrate surface area utilized for the layout of cells can thus be increased; this permits an increased number of cells to be mounted on the same substrate. The integration density increases. However, by taking account of the fact that the requirement of higher integration will continue endlessly in the art of CCD imagers, the advantages of the CCD imager structure will reach a limit in the near future.

SUMMARY OF THE INVENTION

It is therefore an object of the present invention to provide a new and improved solid-state imaging device.

It is another object of the invention to provide a new and improved solid-state image sensing device which can exhibit an enhanced integration density while attaining an excellent quality of reproduced image.

It is a further object of the invention to provide a new and improved one-chip charge-coupled imaging device which can exhibit an enhanced integration density while attaining an excellent quality of reproduced image.

In accordance with the above objects, the present invention is drawn to a specific image sensing device, which includes a substrate, an array of cells on the substrate, a plurality of spaced-apart first charge transfer sections extending in a first direction on the substrate, and a second charge transfer section extending in a second direction transverse to the first direction on the substrate. The second charge transfer section is coupled to the first charge transfer section. The cell array includes a plurality of cells that are arranged in the second direction between adjacent ones of the first charge transfer sections on the substrate.

The foregoing and other objects, features, and advantages of the invention will become apparent from the following more particular description of preferred embodiments of the invention, as illustrated in the accompanying drawings.

BRIEF DESCRIPTION OF THE DRAWINGS

FIG. 1 shows in cross-section the main a part of a charge-coupled device (CCD) image sensing device in accordance with one preferred embodiment of the invention.

FIG. 2 illustrates in schematic form the plan view of the imager of FIG. 1.

DETAILED DESCRIPTION OF THE PREFERRED EMBODIMENTS

Figure 3:
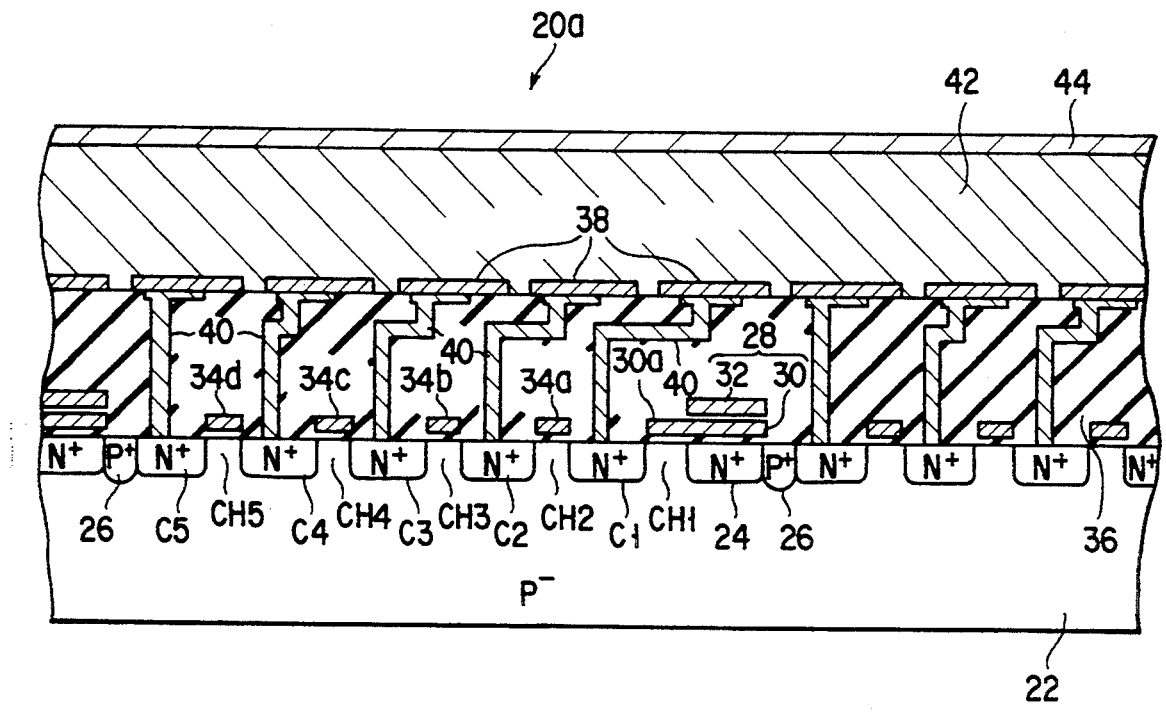
FIGS. 3 and 4 show in cross-section the main parts of charge-coupled device (CCD) image sensing devices also embodying the invention.

Referring now to FIG. 1, a charge-coupled device (CCD) image sensing device in accordance with one preferred embodiment of the present invention is generally designated by the numeral 20. The CCD imaging device 20 includes a semiconductor substrate 22, which may be made from silicon of lightly-doped P (P−) type conductivity. Substrate 22 has a top surface, on which a plurality of parallel charge-transfer channel layers 24 of heavily-doped N (N+) type conductivity are formed. These channel layers extend in a first direction on substrate 22 to constitute the "vertical CCD shift registers." A plurality of heavily-doped P type (P+ type) semiconductor layers 26 extend substantially in parallel with CCD shift register layers 24 on substrate 22. Layers 26 act as "channel stoppers."

A plurality of columns of spaced-part picture elements or cells C are formed between the vertical CCD shift register layers 24 and a corresponding one of the channel stopper layers 26 in such a manner that they include two, first and second neighboring cells C1 and C2 arranged in a second direction transverse to the first direction on the substrate 22. These cells C1, C2 may be N+ type semiconductor layers, each of which forms a PN junction with P− type substrate 22 to provide a charge storage diode. The first cell C1 is adjacent to the corresponding vertical CCD shift register layer 24 associated therewith while defining a channel region CH1 therebetween in substrate 22. The second cell C2 is located far from vertical CCD shift register layer 24 in substrate 22 so that cell C1 is positioned between cell C2 and vertical shift register 24. Cell C2 is in contact with channel stopper 26. The specific cell arrangement consisting of a plurality of series-connected cells C1, C2 with respect to one vertical CCD shift register 24 will be called the "NAND cell" structure in the rest of the description.

As shown in FIG. 1, an insulated vertical transfer electrode section 28 overlies each vertical CCD shift register layer 24. Vertical transfer electrode section 28 includes a series of electrode segments 30, 32, adjacent ones of which partially overlap with each other at their end portions along the first direction. The lower electrode segment 30 is located in a first level above the surface of substrate 22; the overlapping end portion of the upper electrode segment 32 has parts that are positioned in a second level above the first level. Electrode segment 30 is at least partially greater in width than the upper electrode segment 32 of FIG. 1 to provide an extended portion 30a that overlies the channel region CH1 as defined between the first cell C1 and the vertical CCD shift register layer 24 in substrate 22. Portion 30a may also act as a charge read gate. Another insulated electrode 34 is formed at the first level over the substrate surface to overlie a second channel region CH2 as defined between the spaced-apart first and second cells C1, C2 in substrate 22. Layer 24 and electrode section 28 constitute a vertical CCD shift register section 46 (see FIG. 2). Electrode 34 will be called the "cell-to-cell" charge transfer electrode.

A dielectric layer 36 is formed on the substrate 22 to cover the cells C1, C2 and the electrode layers 30, 32, 34. A plurality of picture element electrodes (pixel electrodes, or cell electrodes) 38 are arranged on dielectric layer 36; cell electrodes 38 correspond in number to cells C. A plurality of lead electrodes 40 are formed in layer 36 so that they extend substantially perpendicularly to the substrate surface, causing cell electrodes 38 to be electrically connected to respective charge storage diodes of cells C. Some of the lead electrodes 40 (those associated with cells C1 in this embodiment) have "L"-shaped or stair-step like profile as shown in FIG. 1. The manufacture of such cross-sectional structure of lead electrodes 40 is not so difficult in the presently available semiconductor manufacturing technology: such electrodes 40 may be fabricated, for example, by using a "multiple layer lamination" technique as follows. After a dielectric layer section is deposited on the substrate 22 as a lower part of layer 36, vertical straight contact holes are formed therein. The contact holes are provided with conductive material buried therein to provide the lower half portions of lead electrodes 40. An upper dielectric layer section is deposited on the lower dielectric layer section, and is then subjected to an etching treatment, whereby a corresponding number of vertical straight contact holes are formed therein at different pitches. These upper contact holes are buried with conductive material, thereby allowing any contact hole in the lower dielectric layer section to be electrically connected with a corresponding one of the upper dielectric layer section.

As shown in FIG. 1, a photoconversion layer 42 is deposited on the top surface of the dielectric layer 36 so that layer 42 covers the cell electrodes 38. This layer 42 may be made from amorphous silicon; the layer may alternatively be made from amorphous selenium. A transparent conductive thin film 44 is formed on amorphous silicon layer 42. Film 44 may be made from indium-tin-oxide (ITO).

As shown in FIG. 2, the CCD imager 20 further includes a horizontal charge transfer CCD shift register section 48, which is coupled on the substrate 22 to the charge output nodes of the parallel vertical CCD shift register sections 46, which is constituted by the N+ type shift register layer 24 and the transfer electrode segments 28 (30, 32) as described previously. Horizontal CCD shift register 48 extends in the second direction transverse to the first direction on substrate 22. In other words, horizontal shift register 48 extends in parallel with each pair of cells C1, C2 associated with each vertical shift register section 46. It is apparent from viewing FIG. 2 that each vertical shift register 46 is associated with two columns of cells C1, C2 in the first direction. Looking at each pair of series-connected cells C1, C2, a packet of signal charge read out of cell C1 and that of C2 are sequentially transferred in one vertical CCD shift register 46 toward horizontal CCD shift register 48. Horizontal CCD shift register 48 has an output connected to an amplifier 49.

The operation of the NAND type CCD imager 20 is as follows. When an incident image introduced from a scene enters imager 20, the amorphous silicon photoconversion layer 42 of FIG. 1 produces therein signal charge (electrons, in this case). The signal charge is collected by the cell electrodes 38. The collected signal charge is supplied by the lead electrodes 40 to the charge storage diodes of cells C1, C2 substantially simultaneously, and is then stored or accumulated therein. Considering one vertical CCD shift register section 46, the following operation is as follows. The signal charge stored in two columns of cells C1, C2 associated with the certain vertical CCD shift register section 46 will be read in a manner as follows. Firstly, the first column of cells C1 adjacent to the certain vertical CCD shift register 46 are subjected to a charge read operation in such a manner that a packet of stored signal charge is read from a cell C1 through the first read channel region CH1 of FIG. 1 into vertical CCD shift register 28 by suitably pulse-controlling the read gate 30a in potential; subsequently, the second column of cells C2 are subjected to a charge read operation such that a suitable pulse control signal is applied to the cell-to-cell charge transfer electrode 34 of FIG. 1, causing a packet of signal charge stored in a cell C2 to be read out of it into vertical CCD shift register 46 by way of the second channel region CH2 of FIG. 1, the first cell C1 (this cell is now "empty" with charge due to the completion of charge read) and the first channel region CH1 in this order. The charge read out of second cell C2 is transferred in vertical CCD shift register 46 toward horizontal CCD shift register 48 of FIG. 2 in substantially the same manner as in the case of the signal charge of cell C1. The output charge of horizontal CCD shift register 48 is then amplified by the output amplifier 49 connected thereto to provide an electrical image signal.

More specifically, in the case where the signal charge is read out of the first cell column C1, a horizontal line of cells C1 that are associated with different vertical CCD shift register sections 46 are simultaneously subjected to a charge read operation at a time and in such a manner that one selected cell C1 is read with respect to one vertical CCD shift register section 46. At this time, the read charge is forced to enter the N+ type shift register layer 24 of a corresponding vertical CCD shift register section 46. The packets of one-cell signal charge thus read are sequentially transferred within respective vertical CCD shift register sections 46 in the first direction toward the horizontal CCD shift register section 48. Thus, the packets of signal charge indicative of a horizontal one-line image signal are obtained in horizontal CCD shift register 48. Such line-image signal charge is transferred within horizontal CCD shift register 48 in the second direction toward the output of it, and is then amplified by the output amplifier 49 to generate a one-line image signal, which will be supplied to a known image processor circuitry (not shown) in an electronic equipment containing the CCD imager 20. The above line-image signal-charge read operation will be repeated during a vertical blanking period of the imager 20 with respect to the remaining ones of the first column of cells C1. The same goes with the second column of cells C2.

Alternatively, the NAND CCD imager 20 may employ what is called the "all-at-a-time" charge read technique, which is popular in the existing frame interline-transfer (FIT) type CCD image sensors, wherein all the cells of each column are subjected to a charge read operation at a time during the vertical blanking period. The read signal charge packets are transferred within respective vertical CCD shift register sections 46 toward a memory section (not shown), which is arranged between the output nodes of these vertical CCD shift registers 46 and the horizontal CCD shift register 48 on the substrate 22, and is capable of temporarily storing therein the signal charge transferred from vertical CCD shift registers 46 to indicate a plurality of one-line image signals. The packets of line-image signal charge as stored in the memory may be read out one by one into the horizontal CCD shift register 48 and amplified by amplifier 49 to be output externally. In this case, looking at a certain one of the first columns C1, the signal charge packets are read out of all the charge storage diode cells C1 included therein substantially simultaneously into a corresponding one of the vertical CCD shift registers 46 associated with the certain one of the first columns C1. Such read charge packets are temporarily stored in the memory. Thereafter, the second cell columns C2 are then subjected to the "all-at-a-time" charge read operation. The read charge packets of all the cells C2 are transferred in respective vertical CCD shift registers 46 toward the memory to be stored therein. The packets of charge indicative of respective one-line images are read out of register 48 one by one to be amplified by amplifier 49 to finally generate a plurality of one-line image signals that provide an area image reproduction signal.

The significance of the NAND type CCD imager 20 is that it is possible to dramatically enhance the integration density while suppressing or preventing the reproduced image from decreasing in quality. More specifically, unlike the prior art CCD imagers wherein each vertical transfer section is coupled with only one column of cells, the embodiment imager 20 allows each vertical transfer section (vertical CCD shift register section) to be associated with an increased number of columns of cells C1, C2. The individual cell size (that is, charge storage cell area) can be permitted to remain greater to the extent that the magnitude of charge storage in each cell of necessity is satisfactory. As a consequence, the cells to be arranged in the horizontal direction (the second direction) can be increased in number on the substrate of imager 20, while allowing the signal-charge storage capacity and the saturation charge amount of each cell to be as large as required. This means that the integration density is improved to enhance the horizontal resolution of CCD imager 20.

A NAND-type CCD imager 20a shown in FIG. 3 is similar to the imager 20 of FIG. 1 with (1) the cells C1, C2 being replaced with a further increased number (five, for example) of cells C1–C5, each of which is connected to a corresponding one of the pixel electrodes 38, and (2) the cell-to-cell transfer electrode 34 of FIG. 1 being replaced by four electrodes 34a–34d. Each of these cell-to-cell charge transfer electrodes 34a–34d insulatively overlies a channel region CH1, CH2, CH3 or CH4 as defined between adjacent ones of the spaced-apart cells (charge storage diodes) C1–C5 in the substrate 22. Cells C1–C5 are connected in tandem or series-connected with one another with respect to a corresponding vertical CCD shift register layer 24 associated therewith, thereby to constitute a NAND cell structure.

The charge read operation of the NAND-type CCD imager 20a is as follows. Five NAND cells C1–C5 being series-connected to each vertical CCD shift register layer 24 are subsequently subjected to a signal-charge read operation in a predetermined order. More specifically, while these cells C1–C5 are supplied with packets of signal charge from pixel electrodes 38 by way of lead electrodes 40, firstly, cell C1 that is positioned closest to vertical CCD shift register layer 24 is read so that a packet of charge stored therein is fed to this vertical CCD shift register layer 24 through the channel region CH1 below the read gate 30a. Secondly, the cell C2 adjacent to cell C1 is read by potentially controlling the read gate 30a and cell-to-cell transfer electrode 34a, causing a packet of signal charge to be moved into vertical CCD shift register layer 24 by way of the channel CH2, cell C1 being presently "empty" of signal charge, and channel region CH1 in this order. Similarly, cells C3, C4 are read sequentially. Lastly, cell C5 that is farthest in position from vertical CCD shift register layer 24 is subjected to a charge read operation; at this time, read control pulse signals of the same potential are applied to read gate 30a and cell-to-cell transfer electrodes 34a–34d, rendering all the channel regions CH1–CH4 conductive (open). This causes a signal-charge packet of cell C5 to be supplied to layer 24 by way of channel regions CH1–CH4 and empty cells C1–C4. With the embodiment 20a, increasing the number of cell columns with respect to the individual vertical CCD shift register section makes it possible that the integration density further increases to enhance the horizontal resolution more dramatically.

Figure 4:
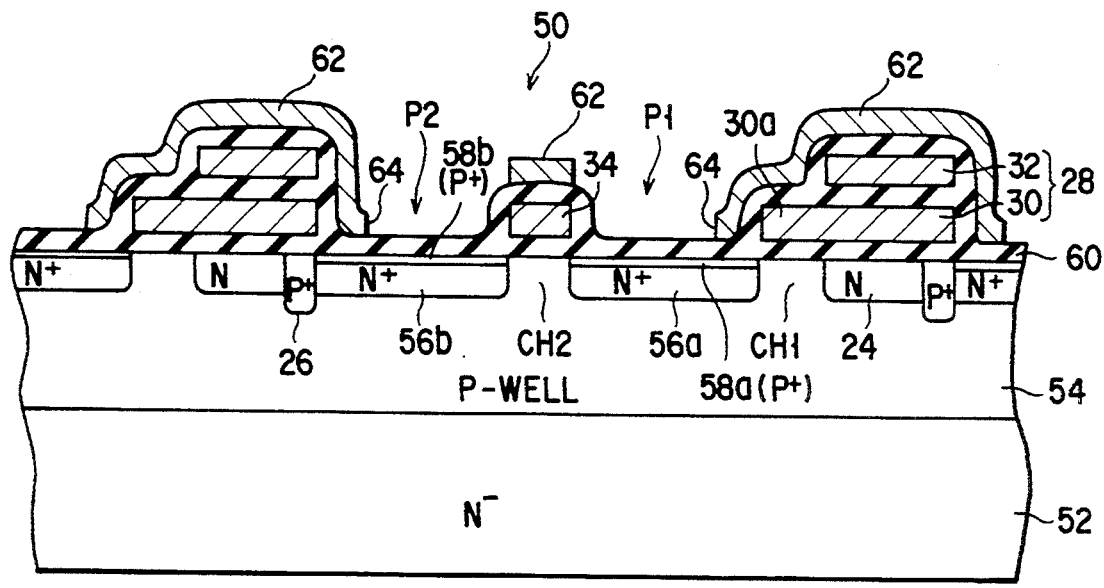

Another NAND-type CCD imager 50 is shown in FIG. 4. The CCD imager 50 is essentially similar to that of FIG. 1 excluding the fact that imager 50 employs a classical cell structure including an array of photosensitive picture elements or cells. More specifically, CCD imager 50 includes a silicon substrate 52 of lightly-doped N (N−) type conductivity. A semiconductive well region 54 of the P type conductivity is arranged in the surface of substrate 52. An array of rows and columns of photosensitive cells P are formed in well region 54 so that two, first and second spaced-apart photosensitive cells P1, P2 are positioned in a well-region surface portion as defined between the vertical CCD shift register layer 24 and the channel stopper layer 26. Cells P1, P2 are connected in series to each other in the second direction, that is, along the direction of the horizontal CCD shift register section (48 of FIG. 2) also provided on substrate 52 within P-well region 54. Each of cells P1, P2 has a PN junction structure that consists of an N+ type semiconductor diffusion layer 56 formed in well region 54, and a P+ type diffusion thin-film layer 58 stacked on N+ type layer 56 to provide a photoconductive cell diode.

As shown in FIG. 4, a dielectric thin film 60 is formed to cover the photosensitive cells P1, P2, the cell-to-cell transfer electrode 34 and the vertical transfer electrode section 28. Dielectric layer 60 may be made from silicon oxide. A metallic layer 62 is formed on dielectric layer 60. Layer 62 is patterned to have a plurality of openings 64 of rectangular planar shape at the positions of cells P1, P2, thereby providing the "incident light entrance" windows. Layer 62 may be made from aluminum (Al), tungsten (W), molybdenum (Mo), molybdenum-silicide (MoSi), tungsten-silicide (WSi), etc. Layer 62 functions as a light shield layer that shields or cuts off the entry of an incident light at the areas other than the light entrance windows 64 for photosensitive cells P1, P2. The signal-charge read method may be similar in principle to that of the imager 20 of FIG. 1. With the embodiment 50, in addition to the achievement of enhanced integration density and the elimination of reduction in quality of a reproduced image signal, it is possible to decrease the number the essential components (such as the photoconversion layer 42, cell electrodes 38, lead electrodes 40 of FIG. 1).

Figure 5:
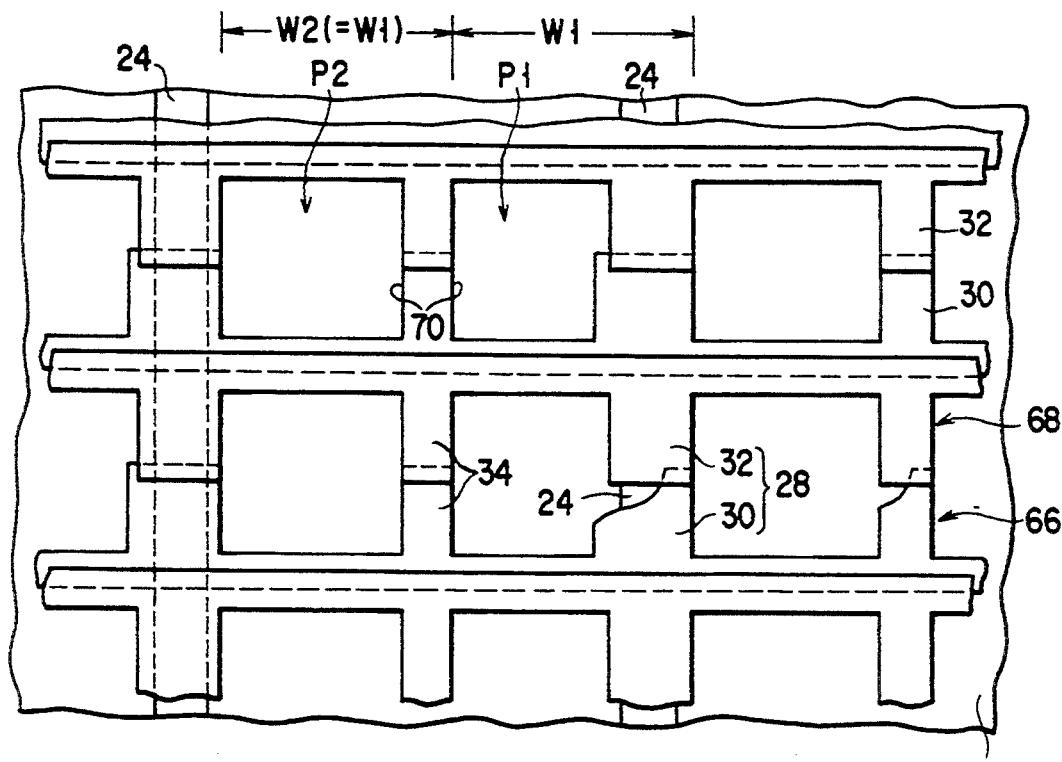
FIGS. 5 and 6 illustrate in schematic form the preferred patterns of photosensitive sections in the FIG. 4 embodiment.
Figure 6:
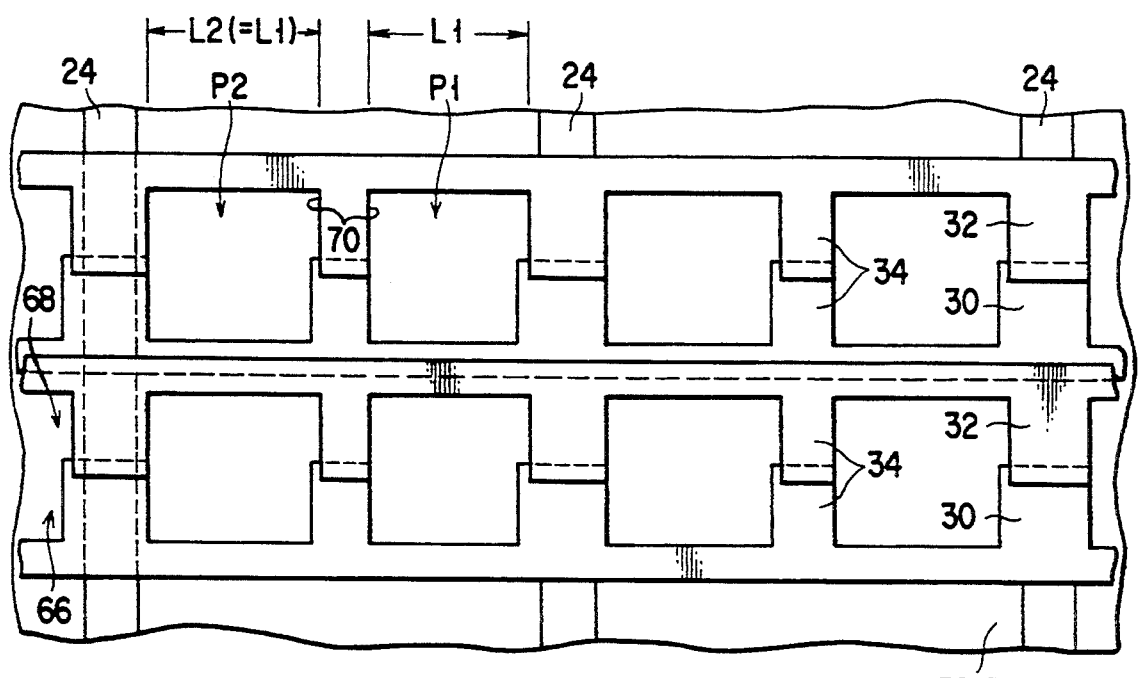

Two exemplary planar patterns of the photosensitive sections for preferable use in the NAND type CCD imager 50 of FIG. 4 are shown in FIGS. 5 and 6. First see FIG. 5, wherein a plurality of first and second comb-shaped electrodes 66, 68 are alternately arranged in the first direction (that is the vertical charge transfer direction over the substrate 52) in such a manner that adjacent ones of these electrodes 66, 68 partially overlap at their opposite "strip" end portions. Each of first comb electrodes 66 provides an alternate array of the vertical transfer electrode segments 30 overlying respective vertical CCD shift register layers 24 in the second direction (the horizontal direction), and the cell-to-cell transfer electrode segments 34. Each of the second comb electrodes 68 defines another alternate array of the vertical transfer electrode segments 32 overlying respective vertical CCD shift register layers 24 and the cell-to-cell transfer electrode segments 34. In other words each of the cell-to-cell transfer electrodes 34 is integrally formed with any one of vertical transfer electrode segments 30, 32. The combination of adjacent ones of comb electrodes 66, 68 defines an array of rectangular cell openings 70 in the horizontal direction as shown in FIG. 5, wherein the edge-to-edge distance W1 of a window for the first cell P1 (W1 includes the widths of segments 30, 32) is equivalent to the the edge-to-edge distance W2 of another window for the second cell P2 adjacent thereto in the horizontal direction (W2 includes the width of thinner cell-to-cell electrode segments 34); that is, W1=W2. In other words, the pitch of photosensitive cell diodes P1, P2 are uniform in the horizontal direction. This results in that cells P1, P2 are slightly different from each other in the maximum photosensitive area, while the patterning design can be made easier.

On the other hand, with the pattern of FIG. 6, the edge-to-edge distance of the vertical transfer electrode segments 30, 32 of the comb electrodes 66, 68 is modified to be different from that of the cell-to-cell transfer electrode segments 34 thereof so as to ensure that the horizontal lengths L1, L2 of adjacent cell openings 70 for cells P1, P2 are equal to each other (L1=L2). As a result, cells P1, P2 are substantially same as each other in the maximum photosensitive area. With such an arrangement, the occurrence of variations in the sensitivity between cells P1, P2 can be eliminated while having the photosensitive area of them maximized uniformly.

Figure 7:
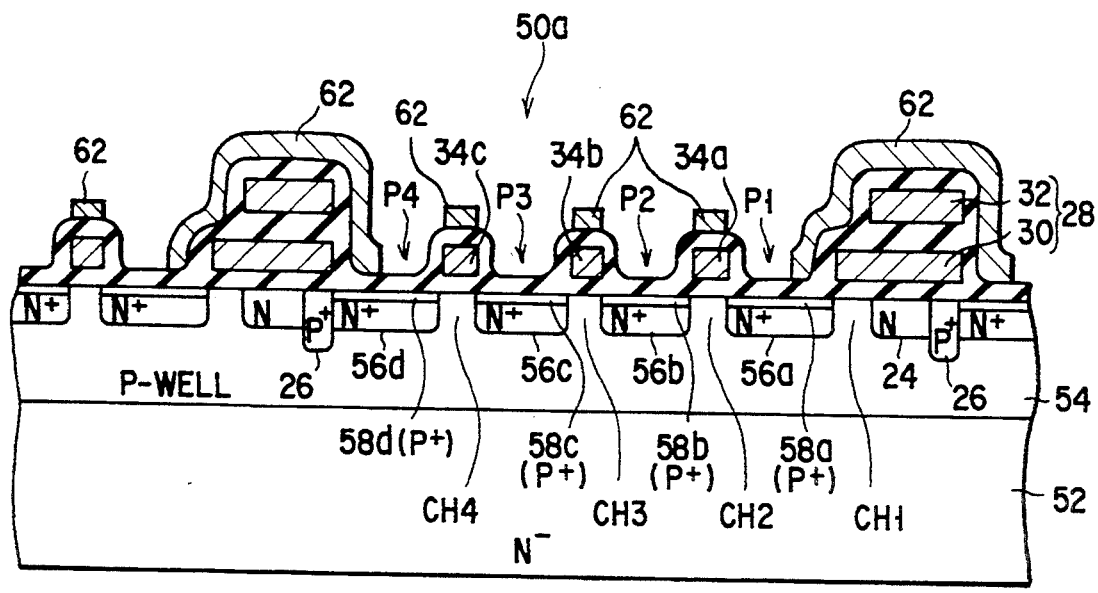
FIG. 7 shows in cross-section the main part of a charge-coupled device (CCD) image sensing device in accordance with a further embodiment of the invention, and FIG. 8 indicates in schematic form the preferred pattern of photosensitive sections in the embodiment of preceding figure.
Figure 8:
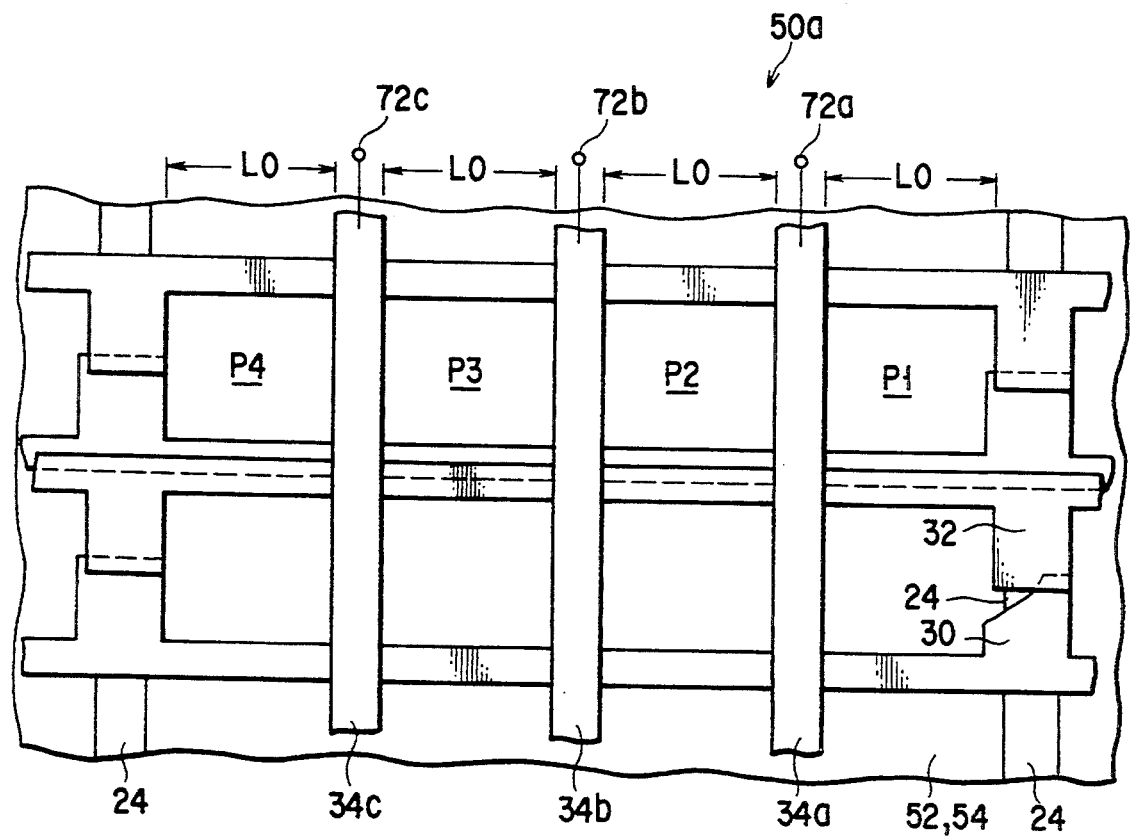

A NAND type CCD imager 50a shown in FIG. 7 is similar to that of FIG. 4 with (1) the photosensitive cell diodes P1, P2 being replaced with an increased number (four, for example) of cells P1–P4, and (2) the cell-to-cell transfer electrode 34 of FIG. 4 being replaced with three cell-to-cell charge transfer electrodes 34a–34c, each of which overlies a corresponding one of channel regions CH2–CH4. These cell-to-cell transfer electrodes 34a–34c are constituted by a plurality of separate parallel linear layers having pulse control signal terminals 72a–72c, which linear layers are located at a third level higher than the second level over the substrate surface and extend in the first direction to insulatively overlie and intersect with the first and second comb-line electrodes forming the partially overlapping vertical transfer electrode segments 30, 32 as shown in FIG. 7. Cell-to-cell electrodes 34a–34c are less in width than vertical transfer electrodes 30, 32. The horizontal pitches of electrodes 30, 32, 34a–34c are suitably arranged so that a series of cells P1–P4 are equivalent to one another in the horizontal length (L0).

Figure 9:
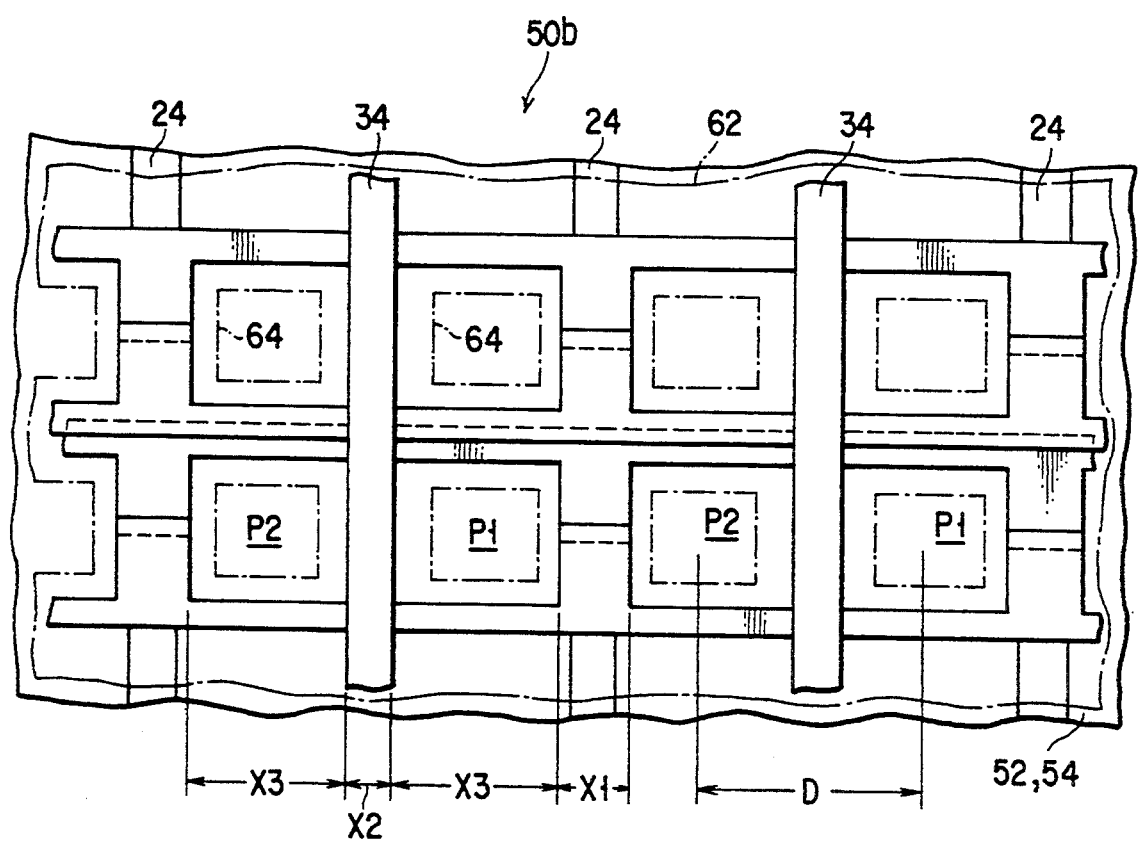
FIG. 9 is a plan view of the main part of a charge-coupled device (CCD) image sensing device in accordance with a still further embodiment of the invention.

A NAND type CCD imager 50b shown in FIG. 9 is similar to that of FIG. 4 with the planar electrode pattern being modified to provide an improved cell opening pattern as follows. In FIG. 9, a portion as defined by a dash-and-dot line indicates the light shield layer 62, which has light entrance windows 64 as described previously. Assuming that the effective width of vertical transfer electrode segments 30, 32 is X1, and that the width of the cell-to-cell transfer electrode 34 is X2, these parameters may satisfy X1>X2. Under such circumstances, the center-to-center distance D of cell windows for cells P1, P2 is determined to meet the following formula:

$$D = \tfrac{1}{2}(X1 + X2) + X3, \tag{1}$$

where, X3 is the horizontal length of photosensitive areas of cells P1, P2. To render Formula 1 applicable also to NAND type CCD imagers having an increased number of NAND cells P, Formula 1 may be generalized as follows:

$$D = 1/N \cdot \{X1 + (N-1)X2\} + X3, \tag{2}$$

where, N is the number of series-connected cells constituting a NAND cell structure associated with a corresponding vertical transfer section 46, and is an integer equal to or greater than 2.

With such an arrangement, it becomes possible to suppress or prevent a fixed pattern noise from taking place due to the differences or variations in the effective photosensitive area among a number of cells P included in one NAND cell unit. Furthermore, a high-sensitivity color image signal can be provided which is inherently free from the occurrence of color deviations or irregularity, by rendering the repeat pitch of a color filter plate to be arranged on the CCD imager 50b of FIG. 9 identical with the pitch D of cell openings 64 of the light shield layer 64.

The present invention is not limited to the above-described specific embodiments and may be practiced or embodied in still other ways without departing from the spirit or essential character thereof.

What is claimed is:

1. An image sensing device comprising:
   a substrate;
   an array of cells on said substrate;
   a plurality of spaced-apart first charge transfer sections extending in a first direction on said substrate;
   a second charge transfer section extending in a second direction transverse to the first direction on said substrate, and being coupled to said first charge transfer sections; and
   said array of cells including plural groups of cells, each said group of cells having a gate shared by adjacent cells and arranged along the second direction with one of said groups of cells between each adjacent pair of said first charge transfer sections.

2. The device according to claim 1, wherein said cells of each said group are series-connected.

3. The device according to claim 1, wherein said cells of each said group are electrically connected in series with each other, thereby to exhibit a NAND cell structure associated with a corresponding one of said first charge transfer sections.

4. The device according to claim 3, wherein each said group of cells include a first cell adjacent to said corresponding one of said first charge transfer sections, and a second cell neighboring to said first cell at an increased distance from said corresponding one of said first charge transfer sections, and wherein said device further comprises:
   read means for reading a charge packet out of said second cell through said first cell toward said corresponding one of said first charge transfer sections.

5. The device according to claim 4, wherein said read means reads out the charge packet from said second cell through said first cell, after causing a charge packet stored in said first cell to be read out toward said corresponding one of said first charge transfer sections.

6. The device according to claim 5, wherein each of said cells includes a photosensitive diode.

7. The device according to claim 5, further comprising:
   a photoconductive layer overlying said array of cells;
   lead electrode means for electrically connecting said photoconductive layer to said cells; and
   each of said cells including a charge storage diode.

8. The device according to claim 7, wherein said charge storage diode includes a PN junction diode.

9. A solid-state imaging device comprising:
   a semiconductor substrate:
   an array of cells on said substrate;
   a plurality of parallel vertical charge transfer sections extending in a first direction on said substrate; and
   a horizontal charge transfer section extending in a second direction transverse to the first direction on said substrate, and being coupled to said vertical charge transfer sections; wherein
   said array of cells includes a separate plurality of cell columns associated with each said vertical charge transfer section, and each said plurality of cell columns includes a preselected number of cells that are series-connected in the second direction.

10. The device according to claim 9, wherein said preselected number of cells include a first cell and a second cell that are connected to provide a NAND cell section.

11. The device according to claim 10, further comprising:
   a cell-to-cell charge transfer electrode overlying a channel region defined between adjacent ones of said first and second cells.

* * * * *

UNITED STATES PATENT AND TRADEMARK OFFICE
CERTIFICATE OF CORRECTION

PATENT NO. : 5,418,387
DATED : May 23, 1995
INVENTOR(S) : Nobuo NAKAMURA et al

It is certified that error appears in the above-indentified patent and that said Letters Patent is hereby corrected as shown below:

Abstract, Title Page, Line 9, change "section" to --sections--.

Signed and Sealed this

Twelfth Day of December, 1995

Attest:

*Attesting Officer*

BRUCE LEHMAN

*Commissioner of Patents and Trademarks*